United States Patent
Scuderi et al.

(10) Patent No.: US 8,432,652 B2
(45) Date of Patent: Apr. 30, 2013

(54) PROTECTION APPARATUS AGAINST ELECTROSTATIC DISCHARGES FOR AN INTEGRATED CIRCUIT AND RELATED INTEGRATED CIRCUIT

(75) Inventors: Angelo Scuderi, Nicolosi (IT); Giovanni Cali, Catania (IT); Salvatore Scaccianoce, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 172 days.

(21) Appl. No.: 13/095,697

(22) Filed: Apr. 27, 2011

(65) Prior Publication Data
US 2011/0267725 A1  Nov. 3, 2011

(30) Foreign Application Priority Data
Apr. 28, 2010  (IT) .............................. MI2010A0725

(51) Int. Cl.
*H02H 9/00* (2006.01)
(52) U.S. Cl.
USPC .............................. 361/56; 361/91.1; 361/111
(58) Field of Classification Search ........... 257/355–360
See application file for complete search history.

(56) References Cited

U.S. PATENT DOCUMENTS

| | | | |
|---|---|---|---|
| 7,010,279 B2 | 3/2006 | Rofougaran | |
| 7,391,596 B2 * | 6/2008 | Khorram | 361/58 |
| 8,276,570 B2 * | 10/2012 | Elkanick et al. | 123/536 |
| 2003/0183403 A1 * | 10/2003 | Kluge et al. | 174/35 R |
| 2005/0264967 A1 * | 12/2005 | Ker et al. | 361/56 |
| 2007/0253128 A1 | 11/2007 | Tiebout et al. | |
| 2007/0296055 A1 | 12/2007 | Yen et al. | |

OTHER PUBLICATIONS

Bakalski, W. et al., "A fully integrated 4.8-6 GHz power amplifier with on-chip output balun in 38 GHz-ft Si-bipolar," IEEE MTT-S International Microwave Symposium Digest, vol. 2:695-698, Jun. 8-13, 2003.
Ding, H. et al., "On-chip millimeter wave Rat-race Hybrid and Marchand Balun in IBM 0.13um BiCMOS technology," Asia-Pacific Microwave Conference, pp. 1-4, Dec. 16-20, 2008.

(Continued)

*Primary Examiner* — Stephen W Jackson
*Assistant Examiner* — Terrence Willoughby
(74) *Attorney, Agent, or Firm* — Seed IP Law Group PLLC

(57) ABSTRACT

There is described a protection apparatus against electrostatic discharges for an integrated circuit; said integrated circuit comprises a radiofrequency or higher frequencies internal circuit. The internal circuit has a first and a second terminals for the output or the input of a radiofrequency or higher frequencies signal. The apparatus comprises first means for electrically connecting said first and second terminals of the internal circuit to at least a PAD and the integrated circuit comprises at least a first and a second supply circuital lines and at least a first and a second protection devices against electrostatic discharges connected to said first and second supply lines. First means have a resistive component and each of said first and second protection devices against the electrostatic discharges have a parasitic capacitive component. The apparatus comprises second means configured to connect said first means and said first and second protection devices against the electrostatic discharges to at least a common circuital point preventing the resistive component of said first means or said internal circuit from combining with the parasitic capacitive components of said first and second protection devices against the electrostatic discharges.

14 Claims, 2 Drawing Sheets

OTHER PUBLICATIONS

Galal, S. et al., "Broadband ESD Protection Circuits in CMOS Technology," IEEE Journal of Solid-State Circuits 38 (12):2334-2340, Dec. 2003.

Hock, G. C. et al., "Design of a 5.8 GHz Rat-Race Coupler on the RO4003C® Substrate," International RF and Microwave Conference Proceedings, Putrajaya, Malaysia, Sep. 12-14, 2006, pp. 253-257.

Issakov, V. et al., "ESD Concept for High-Frequency Circuits," 30th Electrical Overstress/Electrostatic Discharge Symposium, EOS/ESD, pp. 221-227, Sep. 7-11, 2008.

Tseng, C-H. et al., "Compact Rat-Race Coupler Using Shunt-Stub-Based Artificial Transmission Lines," IEEE Microwave and Wireless Components Letters 18(11):734-736, Nov. 2008.

* cited by examiner

PROTECTION APPARATUS AGAINST ELECTROSTATIC DISCHARGES FOR AN INTEGRATED CIRCUIT AND RELATED INTEGRATED CIRCUIT

BACKGROUND

1. Technical Field

The present disclosure relates to a protection apparatus against electrostatic discharges for an integrated circuit and the related integrated circuit.

2. Description of the Related Art

Integrated circuits provide a high degree of functionality in a very small area, such functionalities may include a storage of data, processing of data, reception and transmission of radiofrequency data, etc. Integrated circuits typically comprise millions of transistors with sizes of the order of microns. It is known that bipolar and MOS transistors are subject to destructive breakdown phenomena when they undergo overvoltages due to electrostatic charges. For example, the gate oxide of a CMOS transistor, because of its minimal size, is susceptible to breakdown due to the static electricity, which is commonly referred to as electrostatic discharge or ESD. If one of the transistors of an integrated circuit is damaged by an electrostatic discharge or ESD, the integrated circuit becomes unusable.

For such a reason, integrated circuits comprise protection apparatuses against ESD or commonly ESD protection apparatuses. A diagram of a circuital apparatus for ESD protection is shown in FIG. 1. In the figure there are shown PADs 1, 2 connected to the supply voltages Vdd and Vss and a PAD 3 connected to the supply voltages Vdd and Vss by means of protection devices 10, usually diodes; the same two supply voltages Vdd and Vss are connected to each other by means of circuitry 11, referred to as "power clamp cell" that allows a discharge path for the PADs. The radiofrequency circuit 23 of the integrated circuit is connected to the output PAD 3; the same circuit 23 is coupled to the two supply voltages Vdd and Vss by means of the protection circuits 10.

For high frequency applications the main problem consists of the capacitive contribution of the protection circuits 10, denoted by the parasitic capacitances Cpar. Such parasitic capacitances may strongly limit the performances and reliability of the high frequency circuits.

Different apparatuses have been proposed to overcome said problems.

US 2007/0296055 describes a circuital apparatus for the protection against ESD of a radiofrequency integrated circuit wherein the radiofrequency PAD adapted to transmit the radiofrequency signal of the radiofrequency internal circuit is connected to the voltage supply Vss by means of an inductor belonging to the circuital apparatus for protecting against ESD.

U.S. Pat. No. 7,010,279 describes a circuital apparatus for protecting against ESD of a radiofrequency integrated circuit comprising a transformer balun, an impedance circuit, and a clamping circuit. The transformer balun allows a radiofrequency differential signal to be converted into a single-ended radiofrequency signal. The transformer balun comprises a first winding coupled to the single-ended radiofrequency signals and a second winding coupled to the radiofrequency differential signals. The impedance matching circuit is coupled to the first winding and provides, in conjunction with the impedance of the transformer balun, the impedance matching with an antenna for transmitting the radiofrequency signal. The clamping circuit is operatively coupled to the transformer balun and/or to the impedance matching circuit and, in combination with the transformer and/or the impedance matching circuit, provides protection against ESD for the receiving or transmitting section of the radiofrequency integrated circuit. However in such a way the matching circuit intervenes in protecting the integrated circuit against ESD and this, mainly due to the use of inductors having a resistive component, limits the performances of the radiofrequency or higher frequencies integrated circuits.

BRIEF SUMMARY

One embodiment is a protection apparatus for protecting against electrostatic discharges for an integrated circuit that is improved with respect to those known.

One embodiment is a protection apparatus against electrostatic discharges for an integrated circuit, said integrated circuit comprising a radiofrequency or higher frequency internal circuit, said internal circuit having a first and a second terminals for the output or the input of a radiofrequency or higher frequency signal, first means for electrically connecting said first and second terminals of the internal circuit to at least a PAD, said integrated circuit comprising at least a first and a second supply circuital lines and at least a first and a second protection devices against the electrostatic discharges connected to said first and second supply lines, said first means having a resistive component and each of said first and second protection devices against the electrostatic discharges having a parasitic capacitive component, characterized in that it comprises second means configured to connect said first means and said first and second protection devices against the electrostatic discharges to at least a common circuital point thus preventing the resistive component of said first means or said internal circuit from combining with the parasitic capacitive components of said first and second protection devices against the electrostatic discharges.

BRIEF DESCRIPTION OF THE SEVERAL VIEWS OF THE DRAWINGS

The features and advantages of the present disclosure will be apparent from the following detailed description of its practical embodiments, shown by way of non-limiting example in the accompanying drawings, wherein.

DETAILED DESCRIPTION

Figure 1:
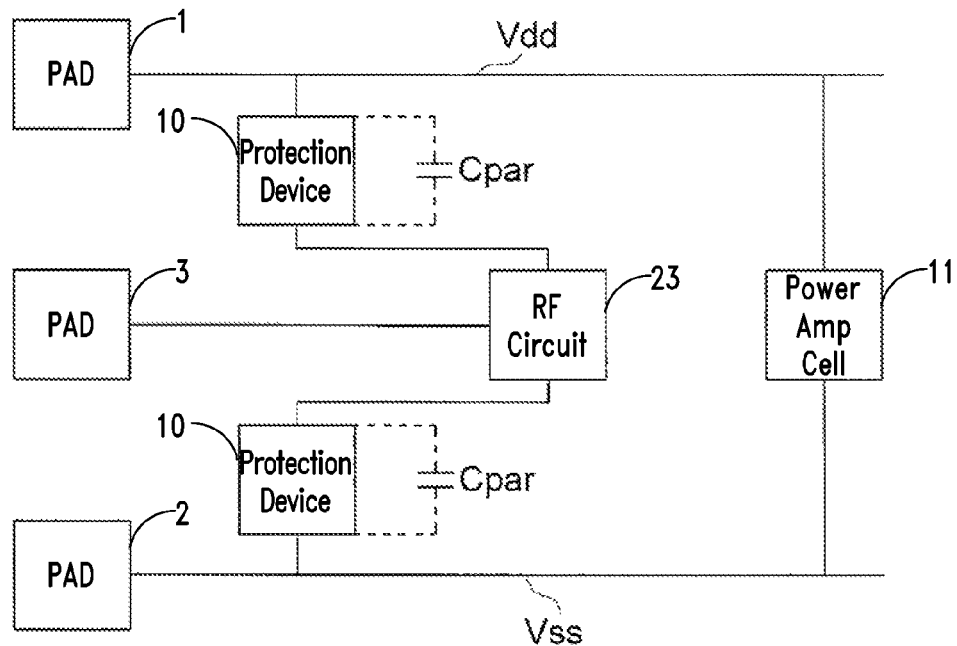
FIG. 1 shows a protection apparatus against electrostatic discharges for an integrated circuit in accordance with the known art.
Figure 2:
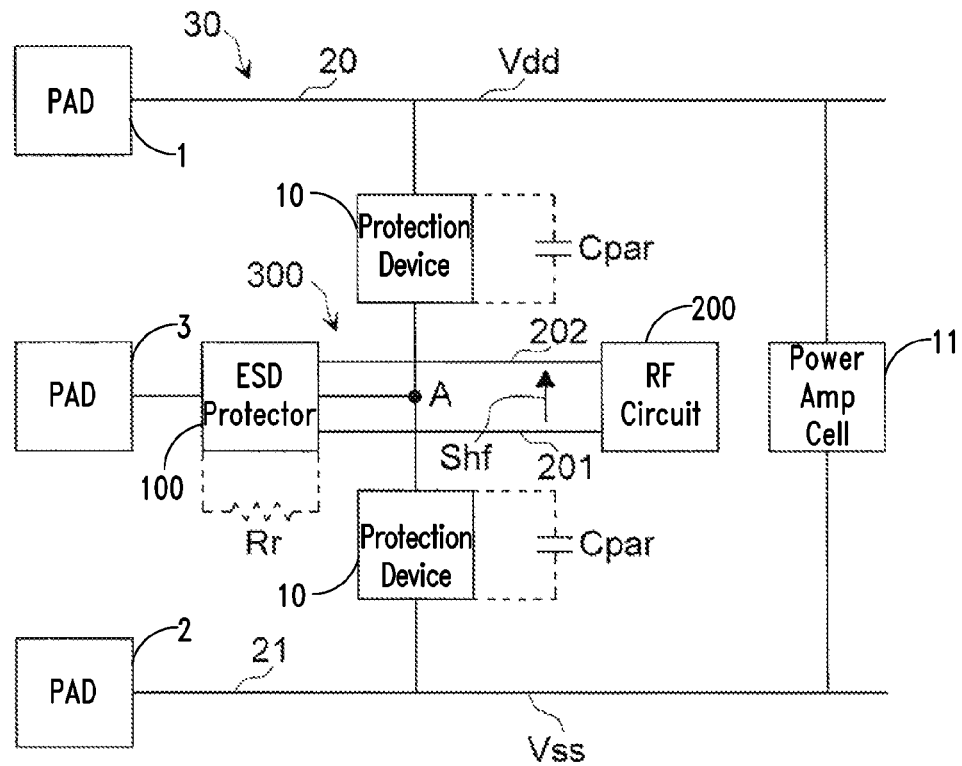
FIG. 2 shows a protection apparatus against electrostatic discharges for an integrated circuit in accordance with the present disclosure.

Referring to FIG. 2, there is shown a protection apparatus against electrostatic discharges for an integrated circuit in accordance with the present disclosure. The circuit of FIG. 2 comprises an integrated circuit 30, formed on a semiconductor substrate, for example silicon, and provided with PADs 1, 2 connected to the supply voltages Vdd and Vss with appropriate supply lines or paths 20, 21; the same two supply voltages Vdd and Vss are connected to each other by means of circuitry 11, referred to as "power clamp cell" that allows a discharge path for the PADs. The radiofrequency or higher frequency (for example microwave frequencies) internal circuit 200 is coupled to at least an output PAD 3 by an ESD protector 100. Protection devices 10 that protect against electrostatic discharges are connected to the supply voltages Vss and Vdd. Devices 10 and circuitry 11 belong to the protection apparatus that protects against electrostatic discharges for an integrated circuit in accordance with the present disclosure.

The ESD protector 100 is configured for electrically coupling first 201 and second 202 output terminals of the internal circuit 200 with the at least one output PAD 3. In such a way a radiofrequency or higher frequency signal Shf, particularly a differential signal, may be transferred from circuit 200 to the PAD 3 or vice versa. Circuit 200 may also convert the differential signal Shf into a single signal on the PAD 3. The ESD protector 100 has a resistive component Rr while the devices 10 each have a parasitic capacitive component Cpar. The protection apparatus against electrostatic discharges further comprises connection circuitry 300 configured to connect the ESD protector 100 and devices 10 to a common circuital point A, preventing the resistive component of the circuit 200 or ESD protector 100 from combining with and particularly adding to the parasitic capacitive component Cpar of devices 10, that is preventing the formation of a filter RC limiting the signal frequency Shf. Indeed in such a way the resistive component of the circuit 200 or the ESD protector 100 is prevented from adding to the parasitic capacitive component Cpar of devices 10 for the presence of the signals depending on the capacitances Cpar which are in phase opposition on the point A, that is because the contributions of signal due to the parasitic capacitances Cpar of the two devices 10 annul each other at the common circuital point A. The connection circuitry 300 is adapted to connect the devices 10 and the ESD protector 100 to the common circuital node A, that is a circuital node that behaves as a virtual ground node. Protection devices 10 are so connected between the virtual ground node A and the two PADs 1 and 2 and are not involved in the electrically coupling of the circuit 200 and PAD 3 for collecting or inputting the high frequency signal Shf; the impedance seen from the terminals 201, 202 of circuit 200 does not comprise the capacitive contribution of the parasitic capacitive components Cpar of devices 10. Devices 10, with their parasitic capacitances Cpar, do not limit the performances of the radiofrequency or higher frequencies integrated circuit 200. Circuit 200 is preferably a circuit with a differential output.

Integrated circuit 30 comprises the ESD protector 100 that is therefore arranged on the chip of the integrated circuit. The ESD protector 100 may comprise hybrid couplers, combiners, transformers or coupled inductors.

Figure 3:
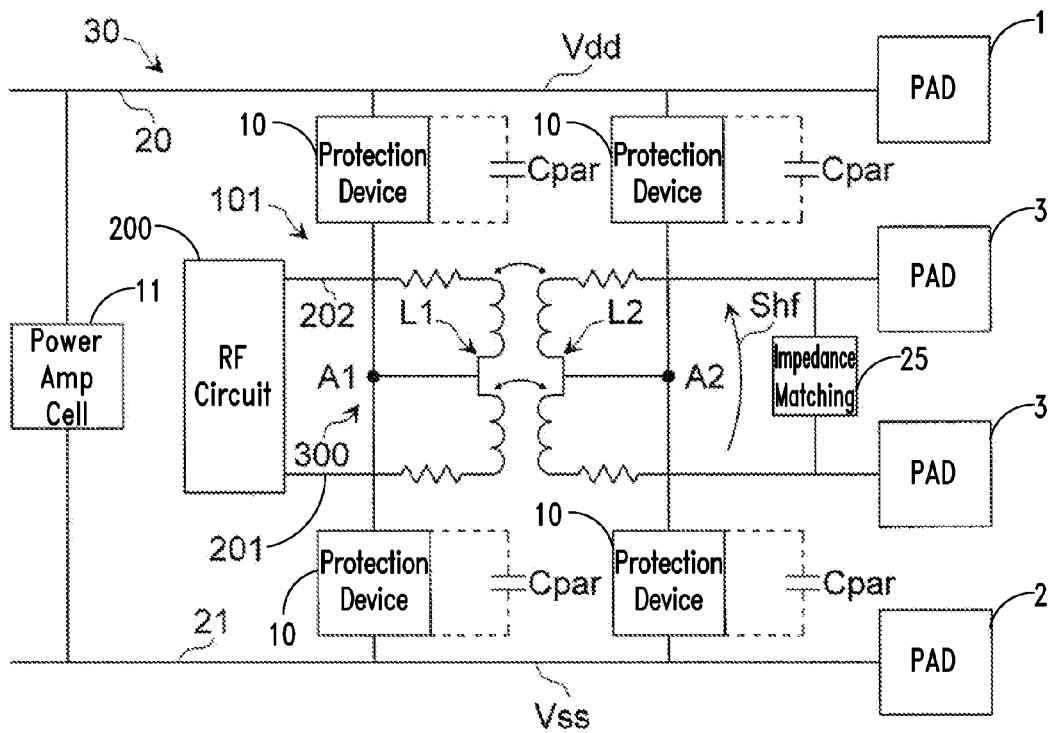
FIG. 3 shows a protection apparatus against electrostatic discharges for an integrated circuit in accordance with a first embodiment of the present disclosure.

FIG. 3 shows a protection apparatus against electrostatic discharges for an integrated circuit in accordance with a first embodiment of the present disclosure. The ESD protector 100 of said first embodiment comprise a transformer balun 101 comprising a primary winding L1 and a secondary winding L2 both of the central tap type. The terminals of the primary winding L1 are connected to terminals 202 and 201 of the radiofrequency or higher frequency circuit 200. The primary winding L1 is coupled to the secondary winding L2, always of the central tap type, having the terminals connected to two PADs 3 for inputting or outputting the signal Shf. There is preferably an impedance matching circuitry 25 between the terminals of the PADs 3 in common with the terminals of the secondary winding L2. The two central taps are coupled to the supply voltages Vdd and Vss by means of two respective pairs of ESD protection devices 10. The connection circuitry 300 in such a case comprise the electric connections of the central taps of the windings L1 and L2 and the electric connections of the pairs of the devices 10 to the different nodes A1 and A2 acting as virtual ground points. Transformer balun 101 formed on a chip represents a low impedance path for the electrostatic discharges. The resistance on a chip, playing an important role in protecting against ESD because it is arranged in series between PAD 3, where the event of an electrostatic discharge takes place, and nodes A1, A2, to which the protection circuits 10 are connected, should be as low as possible. The use of common nodes A1, A2 allows to have use of the benefits of the virtual ground node substantially allowing the capacitive contribution of the capacitance Cpar of devices 10 to be cancelled.

Figure 4:
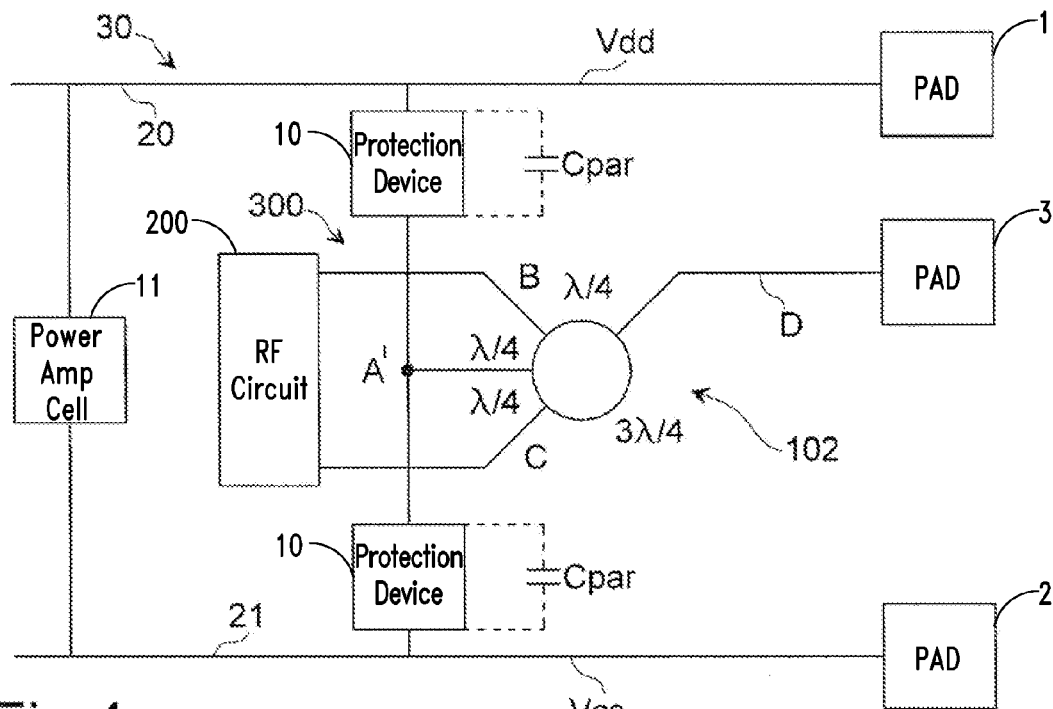
FIG. 4 shows a protection apparatus against electrostatic discharges for an integrated circuit in accordance with a second embodiment of the present disclosure.

FIG. 4 shows a protection apparatus against electrostatic discharges for an integrated circuit in accordance with a second embodiment of the present disclosure. Differently from the first embodiment, the ESD protector 100 of said second embodiment comprises a rat-race device 102 having four terminals A', B, C, D. Said rat-race devices are known in the scientific literature; some papers describing rat-races are: Hanyi Ding, Kwanhim Lam, Guoan Wang and Wayne H Woods, "On-chip Millimeter Wave Rat-race Hybrid and Marchand Balun in IBM 0.13 um BiCMOS Technology", Microwave Conference 2008, APMC 2008, Asia-Pacific Digital Object Identifier: 10.1109/APMC, 2008, 4957919, year of publication 2008, pages 1-4; Chao-Hsiung Tseng and Hsiang-Ju Chen, "Compact Rate-Race Coupler Using Shunt-Stub based Artificial Transmission lines", IEEE Microwave and wireless component letters, Vol. 18, No. 11, November 2008; Goh Chin Hock and Chandan Kumar Chakrabarty, "Design of a 5.8 GHz Rat-Race Coupler on the RO4003C Substrate", 2006 International RF and Microwave conference proceedings, Sep. 12-14, 2006, Putrajaya, Malaysia.

A terminal A' of rat-race 102 is connected to the common node A. Rat-race 102 is preferably of the type wherein, considering λ, the wavelength of the substrate, the terminals 201, 202 of the circuit 200 are connected to rat-race 102 by means of connection to the terminals B and C arranged at λ/4 with respect to terminal A'. Terminal D is connected to 3λ/4 with respect to terminal C and to λ/4 with respect to terminal B; terminal D is connected to the output or input PAD 3 of the signal Shf. Said rat-race 102 is used in case of conversion from a differential signal at the output of circuit 200 into a single-ended signal present on the PAD 3. The connection circuitry 300 in this case comprises the electric connections of rat-race 102 to the isolated node A and the electric connections of devices 10 to the same node A.

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A protection apparatus for protecting an integrated circuit against electrostatic discharges (ESD), said integrated circuit including a radiofrequency or higher frequency internal circuit having a resistance component and first and second terminals for a radiofrequency or higher frequency signal, the protection apparatus comprising:

an ESD protection circuit configured to electrically couple said first and second terminals of the internal circuit to at least a first pad, said ESD protection circuit including a resistive component;

first and second ESD protection devices coupled to first and second supply lines, said first and second ESD protection devices having first and second parasitic capacitive components, respectively;

connection circuitry configured to connect said ESD protection circuit and said first and second ESD protection devices to a first common circuital point and prevent the resistive component of said ESD protection circuit or said internal circuit from combining with parasitic capacitive components of said first and second ESD protection devices.

2. An apparatus according to claim 1, wherein said first and second ESD protection devices are connected between said first and said second supply lines and said first common circuital point so that a capacitive contribution due to the parasitic capacitive components is substantially null at said first common circuital point.

3. An apparatus according to claim 1, wherein the connection circuitry is configured to prevent an impedance seen from said first and second terminals of the internal circuit from including a capacitive contribution of said parasitic capacitive components.

4. An apparatus according to claim 1, further comprising third and fourth ESD protection devices coupled to the first and second supply lines, respectively, wherein:

said ESD protection circuit includes a transformer having a primary winding and a secondary winding, said primary winding having a central tap and end terminals coupled to said first and second terminals of the internal circuit and said secondary winding having a central tap and end terminals coupled to the first pad and a second pad, respectively;

said connection circuitry is configured to connect the central taps of said primary winding and said secondary winding, respectively to the first common circuital point and a second common circuital point, and to connect said third and fourth ESD protection devices to said second common circuital point.

5. An apparatus according to claim 4, further comprising impedance matching circuitry between the first and second pads.

6. An apparatus according to claim 1, wherein said integrated circuit is formed on a semiconductor substrate, said ESD protection circuit includes a four terminal rat-race, and said connection circuitry is configured to connect a first terminal of said rat-race to said first common circuital point.

7. An apparatus according to claim 6, wherein said four terminal rat-race is configured such that said first and second terminals of the internal circuit are connected to second and third terminals, respectively, of the rat-race, the second and third terminals of the rat-race being arranged at a quarter of a wavelength of the substrate with respect to the first terminal of the rat-race, the rat-race having a fourth terminal connected to said first pad and arranged at a quarter of the wavelength of the substrate with respect to the second terminal of the rat-race and at three quarters of the wavelength of the substrate with respect to the third terminal of the rat-race.

8. An integrated circuit, comprising:
a radiofrequency or higher frequency internal circuit, said internal circuit having a resistance component and first and second terminals for a radiofrequency or higher frequency signal;

an ESD protection circuit configured to electrically couple said first and second terminals of the internal circuit to at least a first pad, said ESD protection circuit including a resistive component;

first and second ESD protection devices coupled to first and second supply lines, said first and second ESD protection devices having first and second parasitic capacitive components, respectively;

connection circuitry configured to connect said ESD protection circuit and said first and second ESD protection devices to a first common circuital point and prevent the resistive component of said ESD protection circuit or said internal circuit from combining with parasitic capacitive components of said first and second ESD protection devices.

9. An integrated circuit according to claim 8, wherein said first and second ESD protection devices are connected between said first and said second supply lines and said first common circuital point so that a capacitive contribution due to the parasitic capacitive components is substantially null at said first common circuital point.

10. An integrated circuit according to claim 8, wherein the connection circuitry is configured to prevent an impedance seen from said first and second terminals of the internal circuit from including a capacitive contribution of said parasitic capacitive components.

11. An integrated circuit according to claim 8, further comprising third and fourth ESD protection devices coupled to the first and second supply lines, respectively, wherein:

said ESD protection circuit includes a transformer having a primary winding and a secondary winding, said primary winding having a central tap and end terminals coupled to said first and second terminals of the internal circuit and said secondary winding having a central tap and end terminals coupled to the first pad and a second pad, respectively;

said connection circuitry is configured to connect the central taps of said primary winding and said secondary winding, respectively to the first common circuital point and a second common circuital point, and to connect said third and fourth ESD protection devices to said second common circuital point.

12. An integrated circuit according to claim 11, further comprising impedance matching circuitry between the first and second pads.

13. An integrated circuit according to claim 8, wherein said integrated circuit is formed on a semiconductor substrate, said ESD protection circuit includes a four terminal rat-race, and said connection circuitry is configured to connect a first terminal of said rat-race to said first common circuital point.

14. An integrated circuit according to claim 13, wherein said four terminal rat-race is configured such that said first and second terminals of the internal circuit are connected to second and third terminals, respectively, of the rat-race, the second and third terminals of the rat-race being arranged at a quarter of a wavelength of the substrate with respect to the first terminal of the rat-race, the rat-race having a fourth terminal connected to said first pad and arranged at a quarter of the wavelength of the substrate with respect to the second terminal of the rat-race and at three quarters of the wavelength of the substrate with respect to the third terminal of the rat-race.

* * * * *